United States Patent
Lin et al.

(10) Patent No.: US 9,847,273 B2
(45) Date of Patent: Dec. 19, 2017

(54) HEAT SINK ASSEMBLY AND CLIP THEREOF

(71) Applicant: DELTA ELECTRONICS, INC., Taoyuan Hsien (TW)

(72) Inventors: Yu-Hsien Lin, Taoyuan Hsien (TW); Li-Kuang Tan, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 201 days.

(21) Appl. No.: 13/945,376

(22) Filed: Jul. 18, 2013

(65) Prior Publication Data

US 2014/0262148 A1 Sep. 18, 2014

(30) Foreign Application Priority Data

Mar. 15, 2013 (CN) .......................... 2013 1 0085115

(51) Int. Cl.
*H01L 23/40* (2006.01)
*F16B 2/22* (2006.01)
*F16B 2/08* (2006.01)

(52) U.S. Cl.
CPC ............ *H01L 23/4093* (2013.01); *F16B 2/08* (2013.01); *F16B 2/22* (2013.01); *Y10T 403/595* (2015.01)

(58) Field of Classification Search
CPC .............. H01L 23/0493; F28F 2275/08; F28F 2275/085; Y10T 403/595; F16B 2/0822; F16B 2/22
USPC ................................................ 165/80.1, 80.3
See application file for complete search history.

(56) References Cited

U.S. PATENT DOCUMENTS

| 6,318,452 | B1* | 11/2001 | Lee ...................... H01L 23/4093 |
| | | | 165/80.3 |
| 7,061,764 | B2* | 6/2006 | Lai et al. ...................... 165/80.3 |
| 7,292,442 | B2* | 11/2007 | Yu et al. ....................... 165/80.3 |
| 7,397,663 | B2* | 7/2008 | Chen et al. ................... 165/80.3 |
| 7,644,751 | B2* | 1/2010 | Lin et al. ...................... 165/80.3 |
| 2008/0256764 | A1* | 10/2008 | Hsu ................................. 24/457 |

FOREIGN PATENT DOCUMENTS

TW  I296497  5/2008

* cited by examiner

*Primary Examiner* — Len Tran
*Assistant Examiner* — Hans Weiland
(74) *Attorney, Agent, or Firm* — Muncy, Geissler, Olds & Lowe, P.C.

(57) ABSTRACT

A clip for fixing a heat sink on a retaining bracket includes an elastic supporter, an operating member, a movable fastener and a fixing bar. Two ends of the elastic supporter have a connecting portion and a first buckle portion, respectively. The operating member has a resisting portion, a pivot portion and an operating bar. The pivot portion pivots to the connecting portion. The movable fastener installs on the resisting portion and the connecting portion, and includes two sliding slots, a resisting surface and a second buckle portion. The resisting portion has an arc surface for resisting against the resisting surface. The distance between the apex of the arc surface and the pivot portion is the largest distance between the arc surface and the pivot portion. When the clip is locked, the junction of the resisting portion and the resisting surface excludes the apex of the arc surface.

12 Claims, 6 Drawing Sheets

HEAT SINK ASSEMBLY AND CLIP THEREOF

CROSS REFERENCE TO RELATED APPLICATIONS

This Non-provisional application claims priority under 35 U.S.C. §119(a) on Patent Application No(s). 201310085115.0 filed in People's Republic of China on Mar. 15, 2013, the entire contents of which are hereby incorporated by reference.

BACKGROUND OF THE INVENTION

Field of Invention

The present invention relates to a heat sink assembly and clip thereof.

Related Art

Due to the rapid progress of electronic industry, the electronic modules, such as the CPU, have been greatly improved. Accompanying the improved performance of the CPU, the generated heat is increased. In order to effectively remove the heat generated by the electronic module, a heat sink is commonly disposed adjacent to the CPU or other electronic modules for rapidly taking the heat away. Thus, the CPU or electronic module can operate at the normal working temperature so as to extend the lifespan of the products.

In order to make the heat sink closely attach to the surface of the electronic device, a retaining bracket is usually disposed surrounding the electronic device, and then the heat sink is disposed on the retaining bracket and fastened by a clip. Taiwan Patent No. I296,497 discloses a clip including a clip body, a movable fastener and an operating bar. The clip body is mounted on the heat sink, and the movable fastener and the operating bar are correspondingly disposed at one side of the clip body. The movable fastener has a resisting portion and a pulling portion. When the pulling portion is pulled, the resisting portion contacts against the movable fastener so that the movable fastener moves with relative to the clip body and presses the heat sink to be fixed on the retaining bracket.

However, the conventional clip has a very complicated installation procedure. For example, the clip disclosed in I296,497 has a connection surface configured with two through holes, and two side walls of the movable fastener must pass through the through holes, respectively. The installation of the movable fastener passing through the through holes is difficult. Besides, two opposite sides of the resisting portion have two protrusions, respectively, to be mounted on the two through holes of the clip body. This procedure needs two steps to mount the protrusions, so the entire installation is more complex. Moreover, the manufacturing time for this clip with complex structure is longer.

When the resisting portion of the clip contacts against the movable fastener, the apex of the resisting portion is in contact with the center of the movable fastener. In this configuration, the resisting portion may easily loose from the movable fastener as the electronic product is shaken.

SUMMARY OF THE INVENTION

In view of the foregoing, an objective of the present invention is to provide a clip and a heat sink assembly that have simplified installation procedure and less installing time and can improve the easily loosing issue of the clip.

To achieve the above objective, the present invention discloses a clip for fixing a heat sink on a retaining bracket. The clip includes an elastic supporter, an operating member, a movable fastener and a fixing bar. Two ends of the elastic supporter have a connecting portion and a first buckle portion, respectively. The operating member has a resisting portion, a pivot portion and an operating bar, and the pivot portion pivots to the connecting portion. The movable fastener is installed on the resisting portion and the connecting portion. Herein, the movable fastener has two side walls, a resisting surface connecting the two side walls, and a second buckle portion. The two side walls and the resisting surface define an accommodating space underneath the resisting surface for receiving the resisting portion of the operating member. When the operating bar is pulled, the resisting portion is rotated accordingly to resist against the resisting surface, so that the second buckle portion moves upwards to lock the clip. The fixing bar is inserted into two sliding slots. The resisting portion has an arc surface for resisting against the resisting surface of the movable fastener, and the distance between an apex of the arc surface and the pivot portion is the largest distance between the arc surface and the pivot portion. When the clip is locked, the junction of the resisting portion and the resisting surface excludes the apex of the arc surface.

In one embodiment, each end of the connecting portion has a recess, and the pivot portion is received in the recesses.

In one embodiment, each of two opposite sides of the resisting surface has an oblique plane.

In one embodiment, the moveable fastener further has a first limiting portion disposed between the resisting portion and the operating bar, and the first limiting portion contacts with one side of the connecting portion.

To achieve the above objective, the present invention also discloses a heat sink assembly for dissipating heat generated by an electronic device. The heat sink assembly includes a retaining bracket, a heat sink and a clip. The retaining bracket is disposed at the periphery of the electronic device. The heat sink is disposed corresponding to the retaining bracket and the electronic device. The clip is mounted on the heat sink and includes an elastic supporter, an operating member, a movable fastener and a fixing bar. Two ends of the elastic supporter have a connecting portion and a first buckle portion, respectively. The operating member has a resisting portion, a pivot portion and an operating bar, and the pivot portion pivots to the connecting portion. The movable fastener is installed on the resisting portion and the connecting portion, and includes two sliding slots, a resisting surface and a second buckle portion. The fixing bar is inserted into the two sliding slots. The resisting portion has an arc surface for resisting against the resisting surface of the movable fastener, and the distance between an apex of the arc surface and the pivot portion is the largest distance between the arc surface and the pivot portion. When the clip is locked, the junction of the resisting portion and the resisting surface excludes the apex of the arc surface.

In one embodiment, the heat sink has a receiving recess for receiving the clip.

As mentioned above, the clip of the invention can fix the heat sink on the retaining bracket and press the heat sink closer to the electronic device so as to dissipate the heat generated by the electronic device more effectively. The clip has an operating member pivoting to the connecting portion, a movable fastener installed on the resisting portion and the connecting portion, and a fixing bar inserted into the sliding slots of the movable fastener. Accordingly, the installation procedure of the clip of the invention is much simpler than the conventional clip, so that the entire installation procedure can be simplified so as to benefit to the mass production.

In addition, when the clip of the invention is locked, the junction of the resisting portion and the resisting surface excludes the apex of the arc surface. This feature can prevent the resisting portion from loosing from the resisting surface due to vibration or shaking. Thus, the heat sink can be firmly fixed so as to maintain the integrity of the whole heat sink assembly and thus remain its stability.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
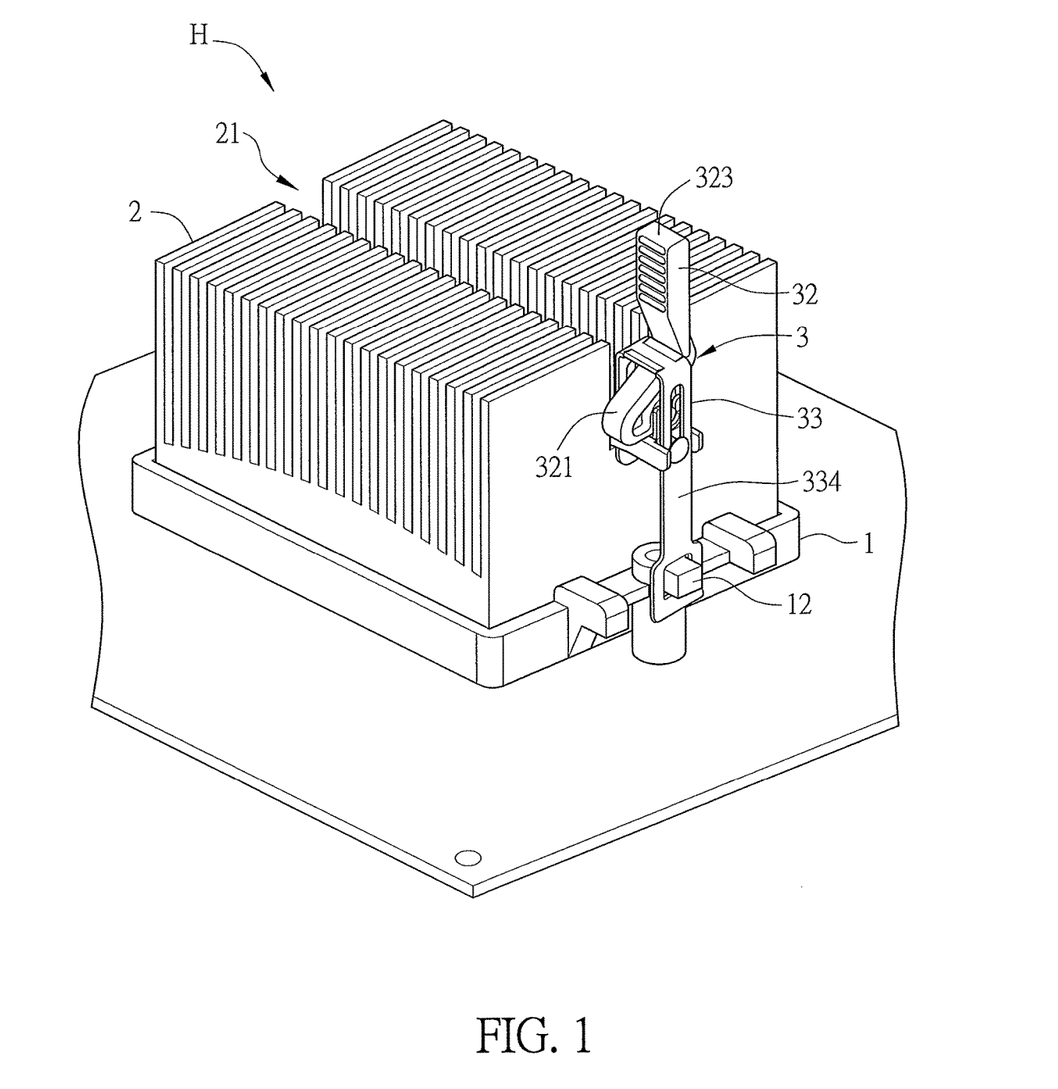
FIG. 1 is a perspective diagram showing a heat sink assembly according to an embodiment of the present invention.
Figure 2:
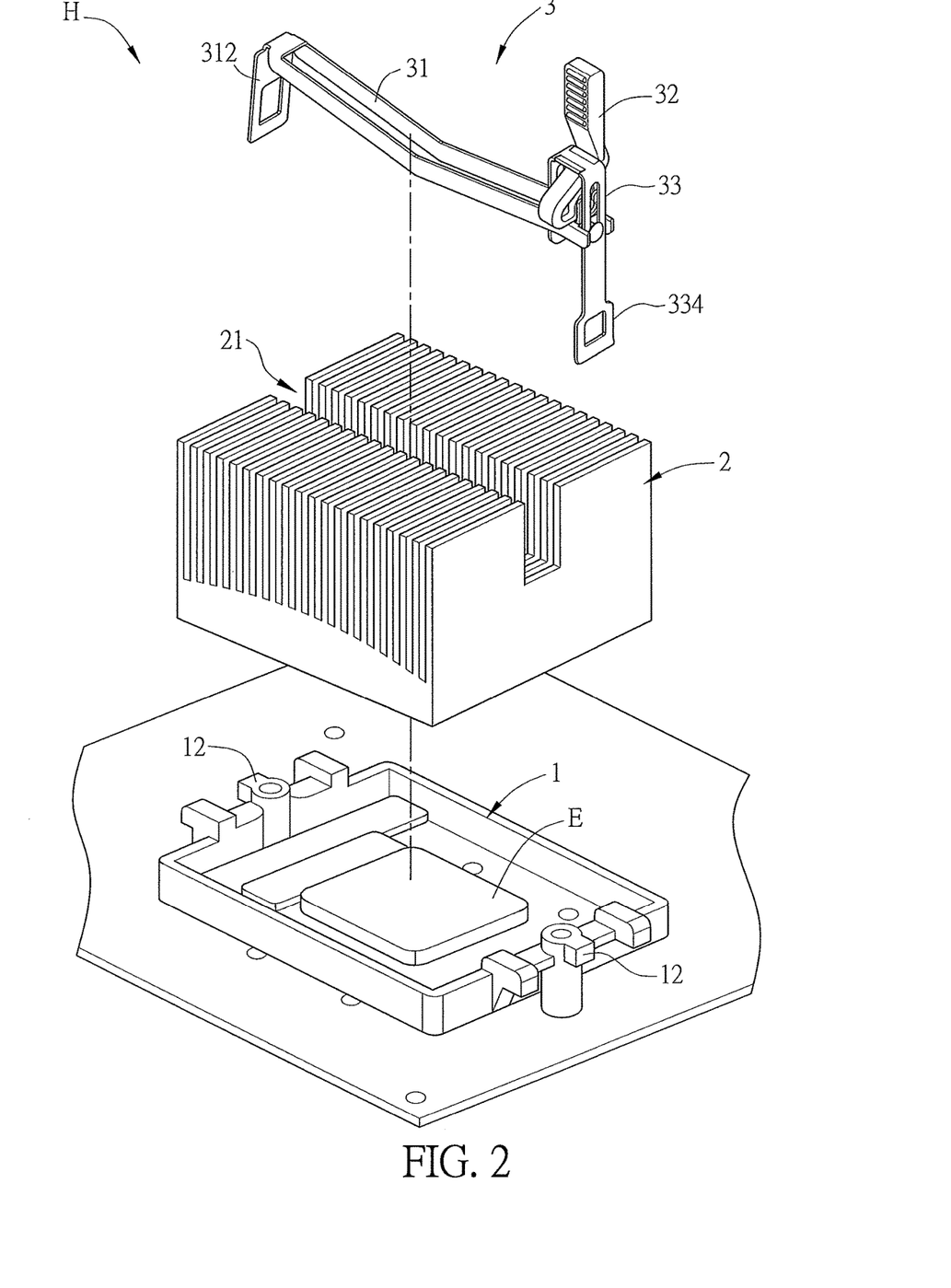
FIG. 2 is an exploded view of the heat sink assembly of FIG. 1.

FIG. 1 is a perspective diagram showing a heat sink assembly H according to an embodiment of the present invention, and FIG. 2 is an exploded view of the heat sink assembly H. Referring to FIGS. 1 and 2, the heat sink assembly H is used for dissipating the heat generated by an electronic device E, and includes a retaining bracket 1, a heat sink 2, and a clip 3. The retaining bracket 1 is disposed at the periphery of the electronic device E, and the heat sink 2 is disposed corresponding to the retaining bracket 1 and the electronic device E. Preferably, the retaining bracket 1 surrounds the electronic device E, and the shape of the retaining bracket 1 fits the structure of the heat sink 2. Accordingly, the heat sink 2 can be accommodated on the retaining bracket 1 and thus disposed on the electronic device E. Then, the clip 3 is installed on the heat sink 2. In this case, the heat sink 2 has a receiving recess 21, and the clip 3 is disposed in the receiving recess 21 for fixing the heat sink 2 onto the retaining bracket 1.

Figure 3:
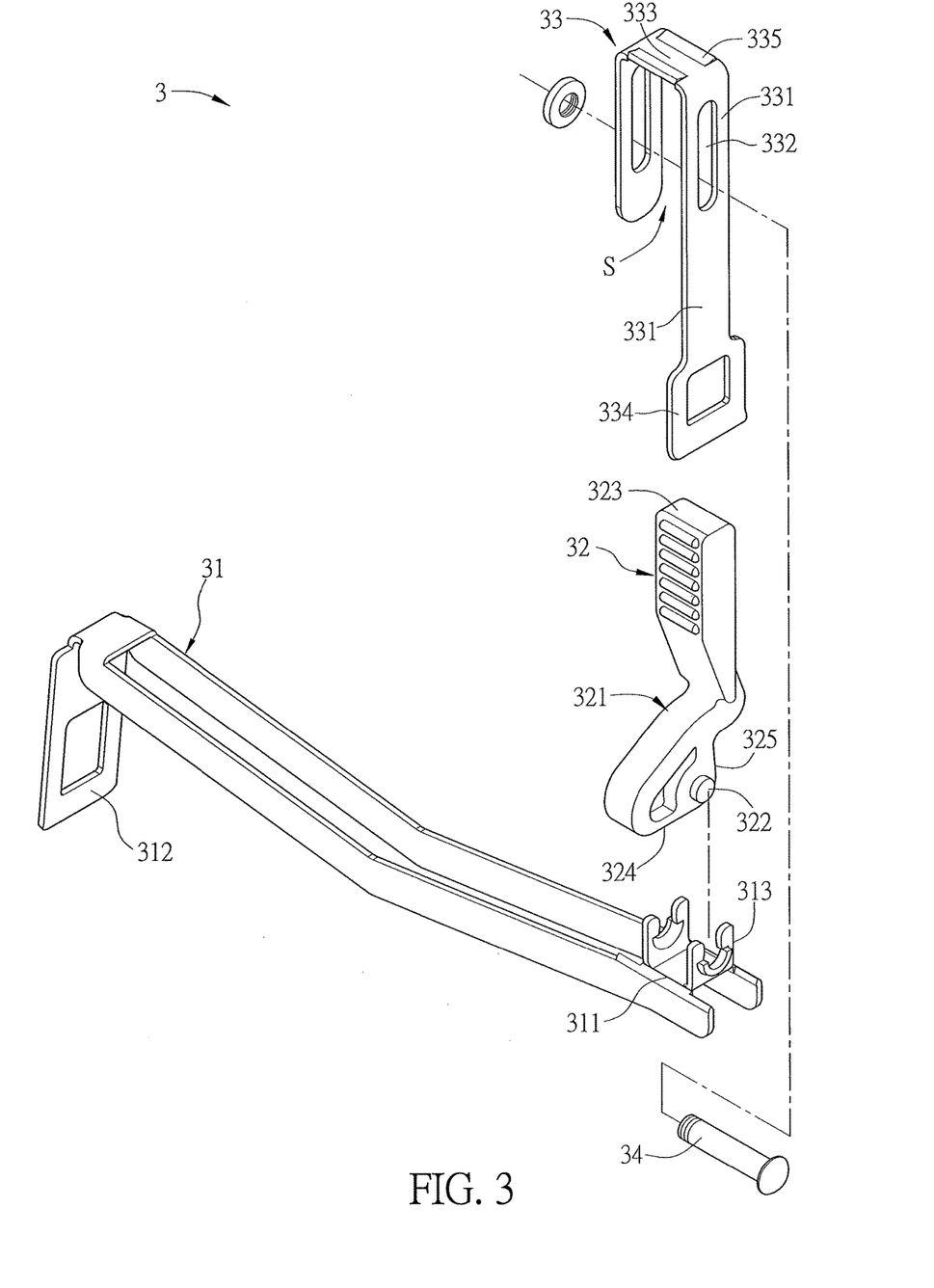
FIG. 3 is an exploded view of the clip of FIG. 1.

FIG. 3 is an exploded view of the clip 3 of FIG. 1. Referring to FIGS. 2 and 3, the clip 3 includes an elastic supporter 31, an operating member 32, a movable fastener 33, and a fixing bar 34. Two ends of the elastic supporter 31 have a connecting portion 311 and a first buckle portion 312, respectively. The operating member 32 and the movable fastener 33 are disposed on the connecting portion 311, and the first buckle portion 312 is locked with the retaining bracket 1. As shown in FIG. 2, two protrusions 12 are disposed at two opposite sides of the retaining bracket 1, respectively, and the first buckle portion 312 is buckled with one of the protrusions 12. The second buckle portion 334 is buckled with the other protrusions 12.

Figure 5:
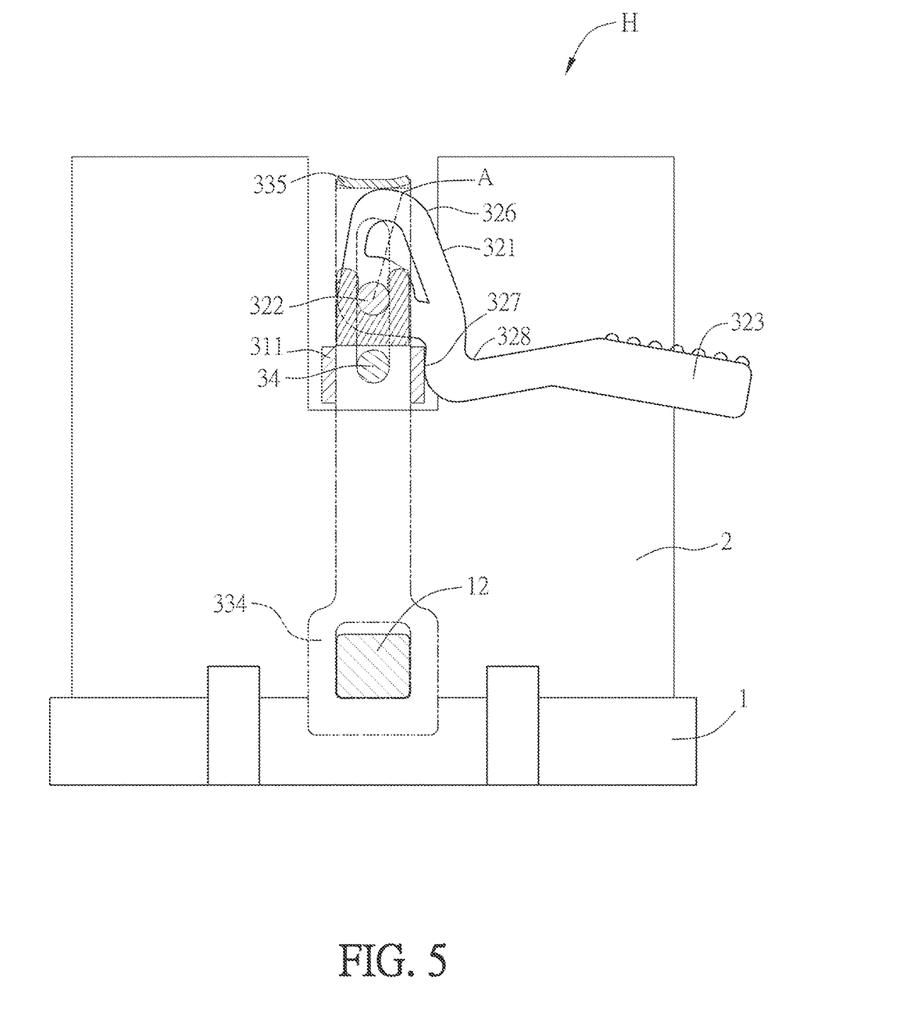
FIG. 5 is a sectional view of the heat sink assembly of FIG. 4 along a line A-A.

Referring to FIG. 5, the operating member 32 has a resisting portion 321, a pivot portion 322, and an operating bar 323. The pivot portion 322 pivots to the connecting portion 311, and the operating member 32 is fixed onto the connecting portion 311 of the elastic supporter 31. Two recesses 313 are configured at two opposite sides of the connecting portion 311, respectively. The pivot portion 322 is rotatably disposed in the recesses 313, and the operation of the operating bar 323 allows the resisting portion 321 to rotate with relative to the connecting portion 311. To be noted, the connecting portion 311 has the recesses 313, which are not through holes, so that the installation procedure for pivotally connecting the pivot portion 322 to the connecting portion 311 becomes simpler, thereby simplifying the process of the mass production.

The movable fastener 33 is installed on the resisting portion 321 and the connecting portion 311. In this embodiment, the movable fastener 33 has a U-shape, and two longitudinally extended sliding slots 332 are configured at two side walls 331 of the movable fastener 33. A resisting surface 333 is provided between the two side walls 331 for connecting the side walls 331, and one of the two side walls 331 has a second buckle portion 334. The two side walls 331 and the resisting surface 333 define an accommodating space S, and the resisting portion 321 is received in the accommodating space S and in contact with the resisting surface 333.

The movable fastener 33 is installed on the resisting portion 321 and the connecting portion 311, while the fixing bar 34 is inserted into the two sliding slots 332 of the side walls 331. Accordingly, the movable fastener 33 is movably disposed with respect to the resisting portion 321 and the connecting portion 311. For example, the fixing bar 34 can be restricted within the sliding slots 332 by configuring screw nuts (see FIG. 3), or by directly deforming the ends of the fixing bar 34 into a horn shape (not shown). When the clip 3 is locked, the fixing bar 34 is located at the bottoms of the sliding slots 332. With reference to FIGS. 1 and 2, the second buckle portion 334 of the movable fastener 33 is locked with a protrusion 12 of the retaining bracket 1, while the first buckle portion 312 of the elastic supporter 31 is locked with the other protrusion 12 of the retaining bracket 1. As a result, the clip 3 can be fixed on the retaining bracket 1.

Figure 4:
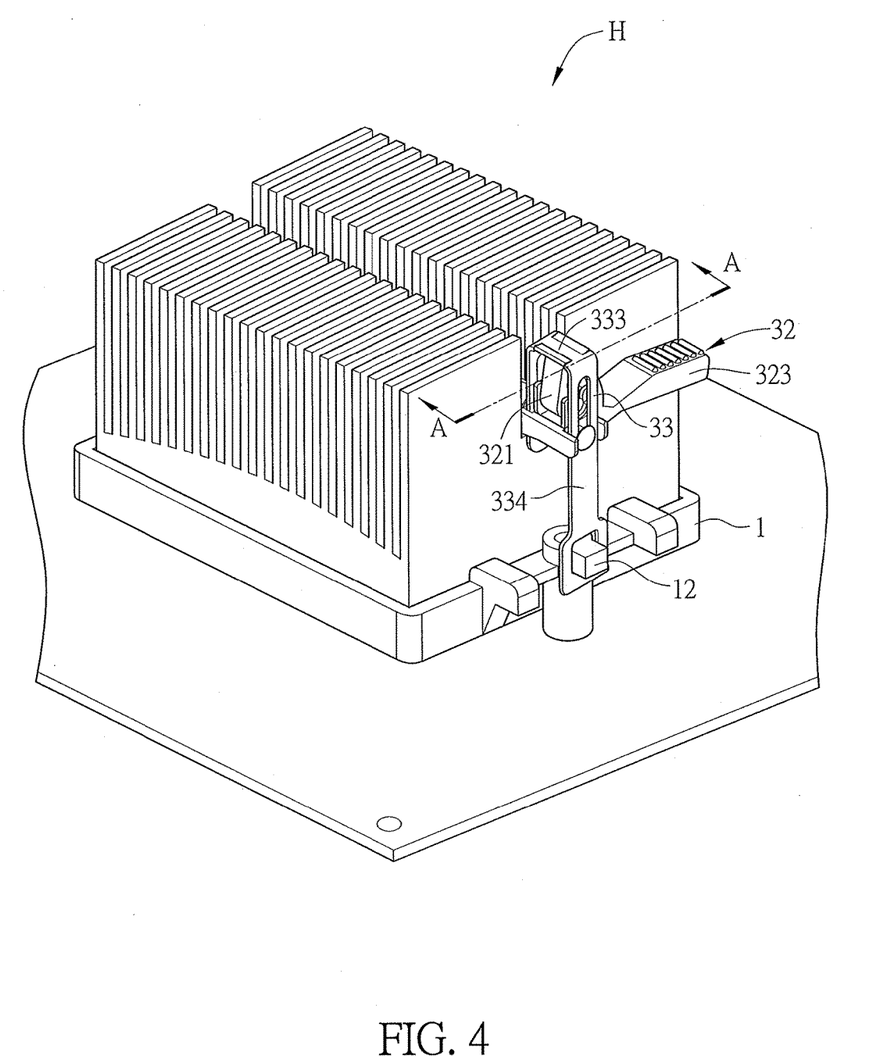
FIG. 4 is a perspective diagram showing the clip of FIG. 1 locked on the heat sink.

FIG. 4 is a perspective diagram showing the clip 3 of FIG. 1 locked on the heat sink 2. Referring to FIG. 4 in view of FIG. 1, the operating bar 323 of the operating member 32 is pulled and moves from the vertical direction (unlocked state as shown in FIG. 1) to the horizontal direction (locked state as shown in FIG. 4). Accordingly, the resisting portion 321 is rotated about the axis (the pivot portion 322), and contacts against the resisting surface 333. This operation can move the movable fastener 33 upwardly with relative to the elastic supporter 31, and then to fix the heat sink 2 on the retaining bracket 1. In this case, the heat sink 2 can be tightly contact with the electronic device E for effectively dissipating the heat generated by the electronic device E.

Figure 6:
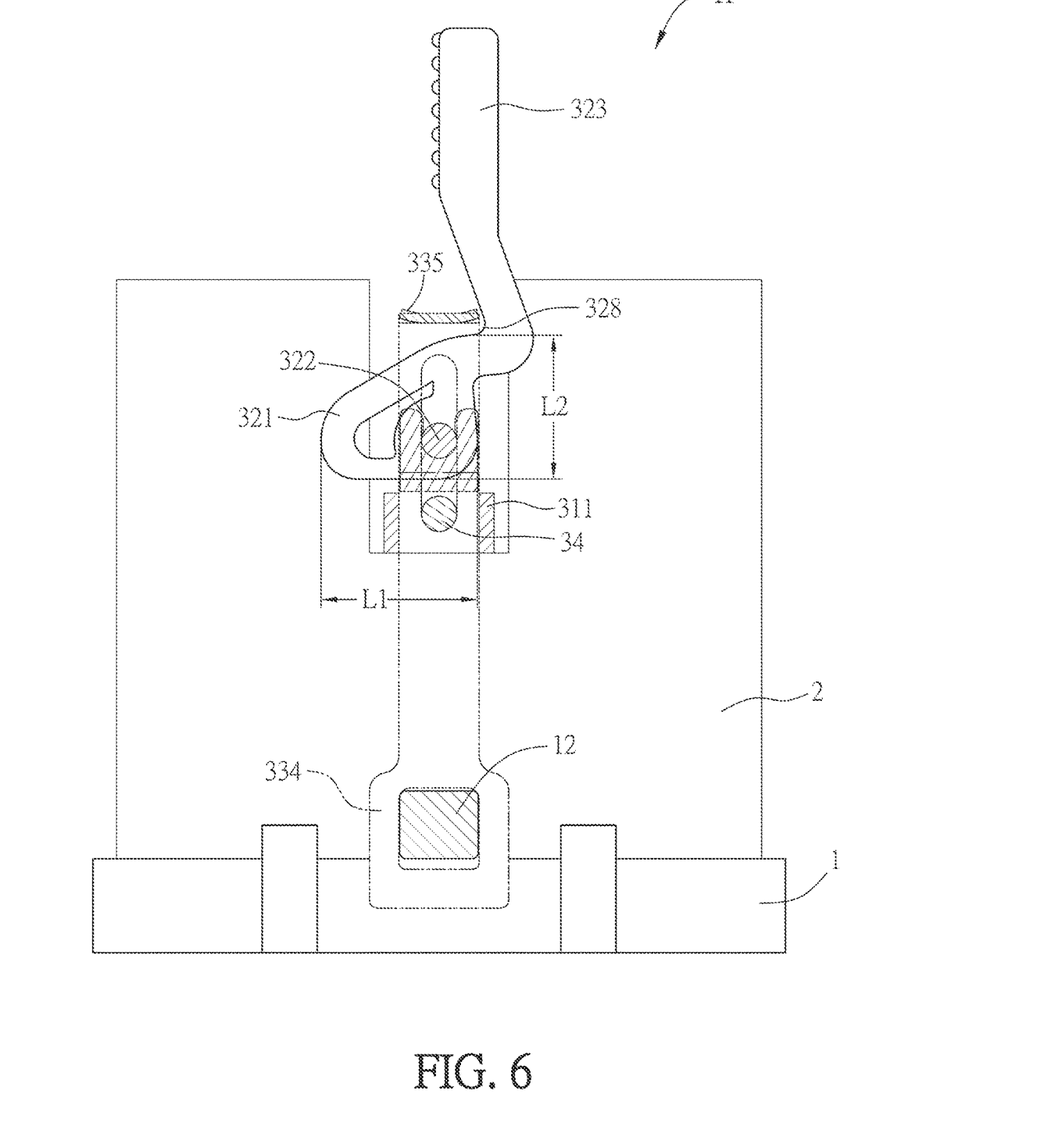
FIG. 6 is a perspective view showing the operation of the clip of FIG. 4.

FIG. 5 is a sectional view of the heat sink assembly of FIG. 4 along a line A-A, and FIG. 6 is a perspective view showing the operation of the clip of FIG. 4. Referring to FIGS. 3 and 6, the resisting portion 321 has a first side wall 324 and a second side wall 325 (see FIG. 3), and the length L1 of the first side wall 324 is longer than the length L2 of the second side wall 325 (see FIG. 6). When the operating bar 323 is in the vertical direction, the accommodating space S of the movable fastener 33 corresponds to the length L2 of the second side wall 325. In this mode, the fixing bar 34 is freely movable between the bottom of the sliding slot 332 and the connecting portion 311. As shown in FIG. 5, when the operating bar 323 is in the horizontal direction, the first side wall 324 with longer length L1 contacts against the resisting surface 333 upwardly. In this configuration, the accommodating space S of the movable fastener 33 corresponds to the length L1 of the first side wall 324, and the fixing bar 34 is pushed to the bottom of the sliding slot 332. Meanwhile, the resisting portion 321 contacts against the resisting surface 333 of the movable fastener 33, and the movable fastener 33 moves upwardly with relative to the elastic supporter 31 so as to push the heat sink 2 closer to the electronic device E.

As shown in FIG. 5, the resisting portion 321 has an arc surface 326 for resisting against the resisting surface 333 of the movable fastener 33. The distance between an apex A of the arc surface 326 and the pivot portion 322 is the largest distance between the arc surface 326 and the pivot portion 322. When the clip 3 is locked, the junction of the resisting portion 321 and the resisting surface 333 excludes the apex A of the arc surface 326. In practice, the operating member 32 further includes a first limiting portion 327 disposed between the resisting portion 321 and the operating bar 323. When the operating bar 323 is in the horizontal direction, the first limiting portion 327 contacts with one side of the connecting portion 311. Due to the configuration of the first limiting portion 327 and the structure of the resisting portion 321, when the resisting portion 321 is rotated, the apex A of the arc surface 326 will contact the resisting surface 333 firstly, and then the first limiting portion 327 contact against the connecting portion 311. Thus, the junction of the resisting portion 321 and the resisting surface 333 does not include the apex A of the arc surface 326. Regarding to the conventional clip, the apex of the resisting portion is in contact with the resisting surface as the clip is locked so that the apex of the resisting portion may easily loose from the resisting surface and the heat sink may be loosed when the clip is shaken. Compared with the conventional clip, the clip 3 of the present invention has an operating member 32 with integrated structure and can solve the issue of easily loosing of the conventional clip.

Preferably, the operating member 32 further includes a second limiting portion 328 disposed between the resisting portion 321 and the operating bar 323. The second limiting portion 328 is located opposite to the first limiting portion 327. When the operating bar 323 is in the vertical direction (or the clip 3 is unlocked), the second limiting portion 328 contacts against one side of the resisting surface 333 as shown in FIG. 6. The configuration of the second limiting portion 328 can maintain the resisting portion 321 at the vertical direction. To lock the clip 3, the resisting portion 321 is pulled to the horizontal direction as shown in FIG. 5. Since the structures of the resisting portion 321 in the vertical direction and the horizontal direction are different, it is easily to recognize whether the clip 3 is locked or not.

Referring to FIGS. 3 and 5, in order to make the rotation of the resisting portion 321 smoother, two opposite sides of the resisting surface 333 have oblique planes 335, respectively. When the resisting portion 321 is moved on the resisting surface 333, the oblique planes 335 can guide the resisting portion 321 to smoothly contact with the resisting surface 333 and slide into and out of the accommodating space S. As a result, the configuration of the oblique planes 335 can make the lock operation of the clip 3 easier and smoother.

In summary, the clip of the invention can fix the heat sink on the retaining bracket and push the heat sink closer to the electronic device so as to dissipate the heat generated by the electronic device more effectively. The clip has an operating member pivoting to the connecting portion, a movable fastener installed on the resisting portion and the connecting portion, and a fixing bar inserted into the sliding slots of the movable fastener. Accordingly, the installation procedure of the clip of the invention is much simpler than the conventional clip so that the entire installation procedure can be simplified so as to benefit to the mass production.

In addition, when the clip of the invention is locked, the junction of the resisting portion and the resisting surface excludes the apex of the arc surface. This feature can prevent the resisting portion from loosing from the resisting surface due to vibration or shaking. Thus, the heat sink can be firmly fixed so as to maintain the integrity of the whole heat sink assembly and thus remain its stability.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A clip for fixing a heat sink on a retaining bracket, comprising:

an elastic supporter, wherein two ends of the elastic supporter have a connecting portion and a first buckle portion, respectively;

an operating member having a first limiting portion, a resisting portion, a pivot portion and an operating bar, wherein the pivot portion pivots to the connecting portion, the first limiting portion directly connects the resisting portion and the operating bar, and the first limiting portion is disposed between the resisting portion and the operating bar, the resisting portion includes a first side wall, a second side wall and an arc surface, the first side wall connects to the arc surface and the second side wall, the arc surface and the second sidewall are not directly connected to each other, and the second side wall and the first limiting portion connect to each other to form a bend, wherein the arc surface, the first side wall, the second side wall and the first limiting portion are clockwise or counterclockwise located around the pivot portion in sequence to form an enclosed area, and the pivot portion passes through the enclosed area;

a movable fastener installed on the resisting portion and the connecting portion, wherein the movable fastener comprises two side walls, a resisting surface connecting the two side walls, and a second buckle portion, the two side walls and the resisting surface define an accommodating space underneath the resisting surface for receiving the resisting portion of the operating member, and when the operating bar is pulled, the resisting portion is rotated accordingly to resist against the resisting surface so that the second buckle portion moves upwards to lock the clip; and a fixing bar disposed under the pivot portion and inserted into the two side walls of the movable fastener, wherein the arc surface is for resisting against the resisting surface of the movable fastener, the distance between an apex of the arc surface and the pivot portion is the largest distance between the arc surface and the pivot portion, and wherein when the resisting portion is rotated, the apex of the arc surface contacts the resisting surface firstly and then the first limiting portion contacts against the connecting portion due to the bend, so that when the clip is locked, the junction of the resisting portion and the resisting surface excludes the apex of the arc surface.

2. The clip according to claim 1, wherein each of two ends of the connecting portion has a recess, and the pivot portion is received in the recesses.

3. The clip according to claim 1, wherein the operating member further comprises a second limiting portion disposed between the resisting portion and the operating bar.

4. The clip according to claim 1, wherein the side wall has a longitudinal extended sliding slot, the fixing bar passes through the sliding slots of the side walls, and when the clip is locked, the fixing bar is located at a bottom of each of the sliding slots.

5. The clip according to claim 1, wherein each of two opposite sides of the retaining bracket has a protrusion, and when the clip is locked, the first buckle portion and the second buckle portion are locked with the protrusions, respectively.

6. The clip according to claim 1, wherein the resisting portion rotates upwardly about the pivot portion to contact against the resisting surface and then the movable fastener moves upwardly.

7. The heat sink assembly for dissipating heat generated by an electronic device, comprising:
a retaining bracket disposed at the periphery of the electronic device;
a heat sink disposed corresponding to the retaining bracket and the electronic device; and
a clip mounted on the heat sink and comprising:
an elastic supporter, wherein two ends of the elastic supporter have a connecting portion and a first buckle portion, respectively,
an operating member having a first limiting portion, a resisting portion, a pivot portion and an operating bar, wherein the pivot portion pivots to the connecting portion, the first limiting portion directly connects the resisting portion and the operating bar, and the first limiting portion is disposed between the resisting portion and the operating bar, the resisting portion includes a first side wall, a second side wall and an arc surface, the first side wall connects to the arc surface and the second side wall, the arc surface and the second sidewall are not directly connected to each other, and the second side wall and the first limiting portion connect to each other to form a bend, wherein the arc surface, the first side wall, the second side wall and the first limiting portion are clockwise or counterclockwise located around the pivot portion in sequence to form an enclosed area, and the pivot portion passes through the enclosed area;
a movable fastener installed on the resisting portion and the connecting portion, wherein the movable fastener comprises two sliding slots, a resisting surface and a second buckle portion; and
a fixing bar disposed under the pivot portion and inserted into the two sliding slots of the movable fastener,
wherein the arc surface is for resisting against the resisting surface of the movable fastener, the distance between an apex of the arc surface and the pivot portion is the largest distance between the arc surface and the pivot portion, wherein when the resisting portion is rotated, the apex of the arc surface contacts the resisting surface firstly and then the first limiting portion contacts against the connecting portion due to the bend, so that when the clip is locked, the junction of the resisting portion and the resisting surface excludes the apex of the arc surface.

8. The heat sink assembly according to claim 7, wherein each of two ends of the connecting portion has a recess, and the pivot portion is received in the recesses.

9. The heat sink assembly according to claim 7, wherein the operating member further comprises a second limiting portion disposed between the resisting portion and the operating bar.

10. The heat sink assembly according to claim 7, wherein each of two side walls of the movable fastener has one of the sliding slots longitudinal extended, the fixing bar passes through the sliding slots of the side walls, and when the clip is locked, the fixing bar is located at a bottom of each of the sliding slots.

11. The heat sink assembly according to claim 7, wherein each of two opposite sides of the retaining bracket has a protrusion, and when the clip is locked, the first buckle portion and the second buckle portion are locked with the protrusions, respectively.

12. The heat sink assembly according to claim 7, wherein the resisting portion rotates upwardly about the pivot portion to contact against the resisting surface and then the movable fastener moves upwardly.

\* \* \* \* \*